US009018962B2

(12) United States Patent
Hoffman et al.

(10) Patent No.: US 9,018,962 B2
(45) Date of Patent: Apr. 28, 2015

(54) METHOD AND APPARATUS FOR PROTECTING POWER TRANSFORMERS FROM LARGE ELECTRO-MAGNETIC DISTURBANCES

(71) Applicants: Gary R. Hoffman, Randolph, NJ (US); Edward S. Kwon, Fort Lee, NJ (US); Hong Cai, Kearny, NJ (US)

(72) Inventors: Gary R. Hoffman, Randolph, NJ (US); Edward S. Kwon, Fort Lee, NJ (US); Hong Cai, Kearny, NJ (US)

(73) Assignee: Advanced Power Technologies, Inc, Randolph, NJ (US)

( * ) Notice: Subject to any disclaimer, the term of this patent is extended or adjusted under 35 U.S.C. 154(b) by 293 days.

(21) Appl. No.: 13/736,927

(22) Filed: Jan. 8, 2013

(65) Prior Publication Data
US 2013/0285671 A1   Oct. 31, 2013

Related U.S. Application Data

(60) Provisional application No. 61/687,459, filed on Apr. 25, 2012.

(51) Int. Cl.
| G01R 31/06 | (2006.01) |
| G01R 31/02 | (2006.01) |
| G01R 31/12 | (2006.01) |
| H02H 7/04 | (2006.01) |
| H02H 3/093 | (2006.01) |
| H02H 3/52 | (2006.01) |

(52) U.S. Cl.
CPC .......... *G01R 31/027* (2013.01); *G01R 31/1227* (2013.01); *H02H 3/093* (2013.01); *H02H 3/52* (2013.01); *H02H 7/04* (2013.01)

(58) Field of Classification Search
CPC ....... H02H 7/04; H02H 7/045; H02H 7/0455; H02H 3/52; H02H 1/0092; H01F 27/34; H01F 30/12; G01R 31/027; G01R 31/1227; G01R 31/12; G01R 31/025; G01R 35/02
USPC ............ 324/127, 547, 726; 340/646, 583.16, 340/584, 660, 664; 361/35, 38, 42, 93.1, 361/93.6
See application file for complete search history.

(56) References Cited

U.S. PATENT DOCUMENTS

| 2,870,416 | A | * | 1/1959 | Heartz | .......................... 332/173 |
| 3,435,337 | A | * | 3/1969 | Inouye et al. | .................. 324/248 |
| 5,133,014 | A | * | 7/1992 | Pritchard | ........................ 381/61 |
| 5,182,547 | A | * | 1/1993 | Griffith | ......................... 340/664 |

(Continued)

FOREIGN PATENT DOCUMENTS

GB                897859    A    *    5/1962

*Primary Examiner* — Patrick Assouad
*Assistant Examiner* — Sean Curtis
(74) *Attorney, Agent, or Firm* — Henry I. Schanzer

(57) ABSTRACT

A protective system far a power transformer having a neutral line connected to ground where large currents can flow in the neutral line due to electro-magnetic disturbances. The system includes circuitry for: (a) sensing the current level in the neutral line and whether it exceeds a predetermined threshold for a predetermined period; and (b) sensing and processing the harmonic content of the load current and determining the existence of certain relationships of the "even" and "odd" harmonics. Signals, including alarms, indicative of excessive conditions are produced. The system may also include circuitry for sensing the load current level and generating a signal alarm if the load level is above a given value when the harmonics and the DC current have values in excess of certain predetermined values.

19 Claims, 9 Drawing Sheets

(56) References Cited

U.S. PATENT DOCUMENTS

| | | | |
|---|---|---|---|
| 5,963,406 A * | 10/1999 | Neiger et al. | 361/42 |
| 6,339,525 B1 * | 1/2002 | Neiger et al. | 361/42 |
| 2007/0052426 A1 * | 3/2007 | Wells et al. | 324/547 |
| 2010/0188240 A1 * | 7/2010 | Wells | 340/660 |
| 2011/0295535 A1 * | 12/2011 | Lewis et al. | 702/64 |
| 2012/0019965 A1 * | 1/2012 | Faxvog et al. | 361/42 |

\* cited by examiner

METHOD AND APPARATUS FOR PROTECTING POWER TRANSFORMERS FROM LARGE ELECTRO-MAGNETIC DISTURBANCES

This invention claims priority from provisional application Ser. No. 61/687,459 filed Apr. 25, 2012 for Method and Apparatus for Detection of Core Saturation of Power Transformers due to Geomagnetically Induced Currents.

BACKGROUND OF THE INVENTION

This invention relates to a problem which occurs when excessively large direct currents (dc) flow in the grounded neutral line of a power transformer (see FIGS. 1 and 2).

Excessively large dc currents can flow in the grounded neutral line of a power transformer when there are large electro-magnetic disturbances present about the power transformer. The core of the power transformer may saturate and depending on the duration of the excessively large dc current flow and the load applied to the transformer, the power transformer may be damaged or destroyed. Accordingly, one aspect of the invention relates to methods and apparatus for detecting core saturation of power transformers due to large electro-magnetic disturbances.

Large electro-magnetic disturbances can result, for example, from geomagnetic storms, or even from nuclear blasts. By way of example, solar flares or storms from sunspot activity follow an 11 year cycle. They begin to increase in intensity every 11 years and peak three to five years after the cycle commences. These storms can affect communication and power systems across the world. Solar flares throw out a cloud of highly charged coronal particles, known as a solar proton event, or "coronal mass ejection" (CME), which hurtle through space. If the cloud is in the direction of the Earth's atmosphere, these particles will be trapped within the Earth's magnetosphere and can cause direct current (DC) flow into any device connected to the Earth. Additionally, many hundred miles of high voltage lines act like an antenna drawing the electro-magnetic pulse from a solar flare toward thousands of transformers on the world's power grids. The absorbed energy can cause many transformers to burn out resulting in disruption and damage to the electrical distribution system and much economic loss including the cost of replacing the burnt out transformers.

The potential difference between the earth and any power apparatus (e.g., transformers, motors, and generators) electrically connected to the Earth (ground) causes a direct current (DC) to flow which may also be referred to as a geo-magnetically induced current (GIC). Where the neutral line of a power transformer is connected to ground, the magnitude of a GIC flowing in the neutral line can vary from a few amperes to several hundred amperes flowing in the earth connection of the power transformer and the current flow can last from several minutes to over an hour. In the case of power transformers having a neutral conductor returned to ground, the GIC (also referred to as $I_{NDC}$) flowing/carried along the neutral conductor can cause the transformer core to saturate.

The probability for core saturation, with respect to the GIC, depends on the design of the transformer with single phase, five legged cores, and shell form designs being the most susceptible. Typically, these types of transformers are the largest in a power system and can present the biggest risk to system reliability should core saturation occur. While three phase core form designs are less susceptible, they too may saturate but at high GIC levels (e.g., over 100 Amps).

Core saturation due to GIC is highly undesirable as the power transformer will become incapable of delivering the required rated power to the load. Also, localized heating and general overheating will occur due to stray flux that induces eddy currents in conductors and metal components within the transformer tank. Such conditions, if allowed to persist without reducing the loading, can lead to catastrophic failure of the power transformer which in turn can affect an entire electric power distribution system.

It is known to monitor the DC neutral current ("$I_{NDC}$") of a power transformer and to use the amplitude of the current to decide whether to remove or lighten the load being carried by the power transformer. However, relying solely on sensing the level of the $I_{NDC}$ is problematic because the $I_{NDC}$ does not accurately predict whether core saturation is actually occurring. It is very difficult to model a transformer to accurately predict the level of $I_{NDC}$ which will cause core saturation. If only the level of the $I_{NDC}$, which is equal to the GIC is used, it is possible that a transformer operator may make an incorrect decision to shed load too early or too late. Shedding load too early will put a strain on the system especially if multiple units are indicating the flow of excessive GIC. In reality, only a few, if any, of the transformers may be adversely affected. However, not removing the load soon enough may result in catastrophic equipment damage due to overheating which could cause the dielectric integrity of the transformer's insulation system to be compromised.

Using other methods to determine core saturation have not proven to be reliable. For example, measurement of harmonics in the RMS current on the high voltage, low voltage and tertiary windings without monitoring $I_{NDC}$ is not a reliable method to determine core saturation. The reason is that specific harmonics associated with GIC can vary depending on transformer design. Some power transformer designs will vary in their harmonic spectrum when subjected to GIC making it extremely difficult to determine if the harmonics are a result of GIC or from the transformer's load or its source. In addition, examining reactive power flow as a means of determining if the transformer core has saturated is not 100 percent reliable as there will always be reactive power (VAR) flow proportional to the magnitude of GIC even though the transformer core is not saturated.

Accordingly, a problem exists in reliably determining when a power transformer is undergoing core saturation as a result of large electro-magnetic disturbances.

Therefore, this invention is directed to method and apparatus for more reliably detecting core saturation of a power transformer due to GIC.

SUMMARY OF THE INVENTION

Systems embodying the invention include means for protecting a transformer, having an input winding and at least one output winding and a neutral line returned to ground, when electro-magnetic conditions are present causing large currents to flow in the neutral line. The protective system includes: (a) sensing means for sensing the direct current (DC) level in the neutral line ("$I_{NDC}$" or "GIC") of the transformer and for determining whether the GIC level is above a predetermined value for more than a predetermined time period and for generating a first alarm signal if this condition occurs; and (b) circuit means for sensing the harmonics of the current present in the transformer's output (or input) winding connected to a load and processing the harmonics to determine whether they exhibit a predetermined criteria for a given time period and for generating a second alarm signal when the GIC exceeds a predetermined level for a predetermined time period and the harmonics exhibit a predetermined condition for a preselected time period.

The circuitry for processing the harmonics may include various circuits for comparing selected even and odd harmonics to determine whether they have certain predetermined relationships.

Systems embodying the invention may also include means for sensing the load level (e.g., the load current level) and generating a third alarm signal if the load level is above a given value when the harmonics and the $I_{NDC}$ or GIG have values which cause the generation of the second alarm signal.

Systems embodying the invention may also include means for automatically controlling (e.g., reducing) the load in response to the second or third alarm signal conditions.

By practicing the invention, the operators and owners of the power transformer equipment can make better decisions regarding the operation of their systems and to enact contingency plans to handle the load and at the same time save a valuable and expensive power transformer from being damaged.

BRIEF DESCRIPTION OF THE DRAWINGS

In the accompanying drawings, which are not drawn to scale, like reference characters denote like components

DETAILED DESCRIPTION OF THE DRAWINGS

As noted above, solar storms/flares cause a larger than normal quantity of high energy electromagnetic fields and a large quantity of highly charged coronal particles to travel towards the Earth. When the highly charged coronal particles enter the Earth's magnetosphere, there is a higher probability of disruption to electrical power distribution systems. The level of disruption of the power systems depends on the geo-spacial relationship of the charged particles trapped in the Earth's magnetosphere and whether these particles have sufficient energy to induce a GIC ($I_{NDC}$) which exceeds predetermined levels for more than a given period of time into the grounded neutral line of the power transformers. The effect of the charged particles on a transformer will be different depending on its location on the Earth. The effect is highly localized and presently there is no way to project where on the Earth the highest impact will occur. Therefore, a function of this invention is to provide an alarm to the operators and owners of transformers, wherever located, if their system is being adversely affected.

Figure 1:
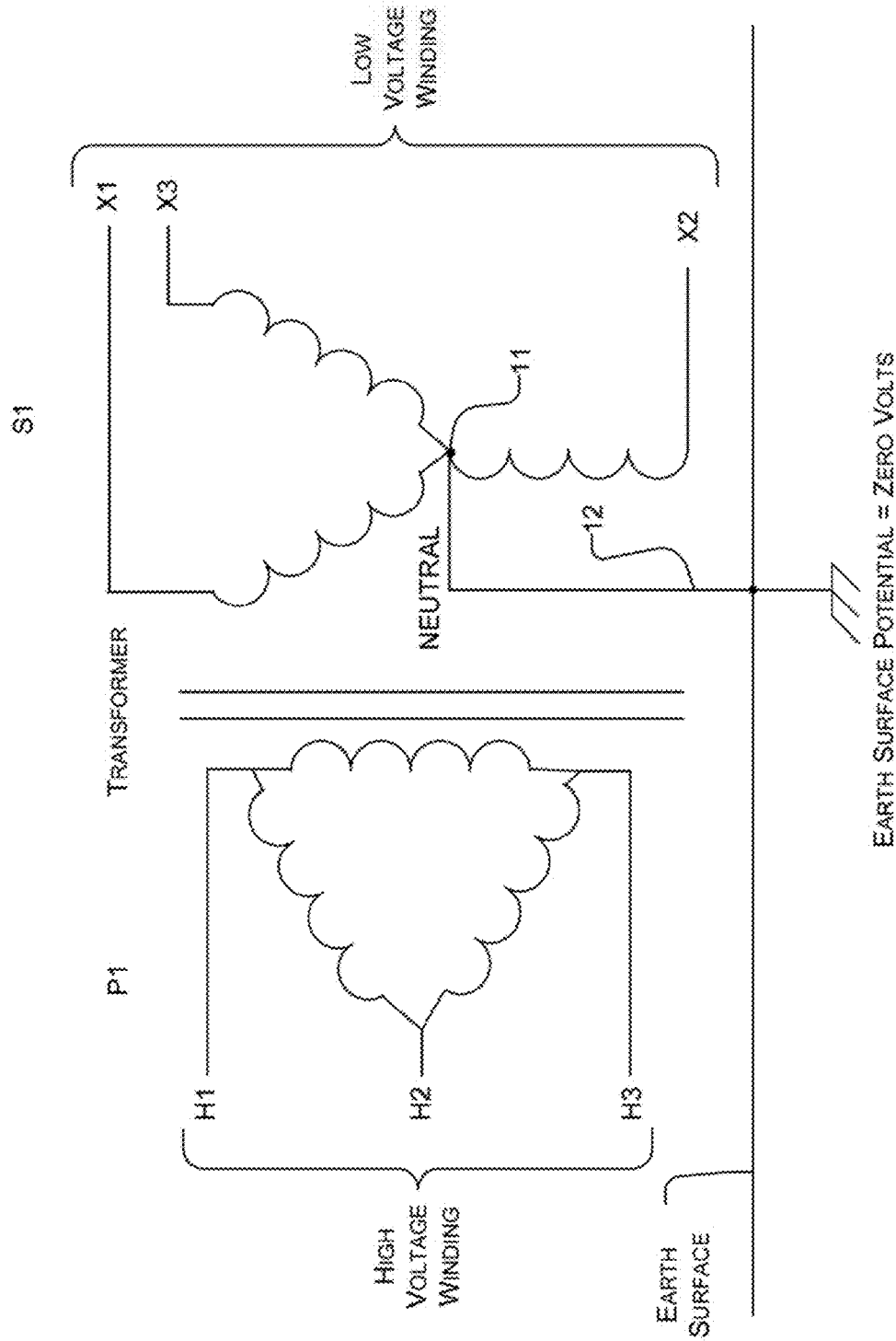
FIG. 1 is a simplified schematic diagram of a prior art power transformer showing the windings of a typical Delta-to-Wye connection.

FIG. 1 shows a power transformer, XFR, having a high voltage primary (P1) which may be configured, by way of example, as a "delta" connection, and a secondary (S1) with windings which may be configured, by way of example, as a "wye" connection. The secondary has 3 phase windings (X1, X2, X3) and a central connection 11 connected via neutral line 12 to Earth ground.

The windings may be wound around a laminated core of high silicon steel. Under normal operation of the transformer there is zero current flowing in the neutral conductor (i.e. there are no zero sequence components). However, current can flow in the neutral leg of the transformer under certain conditions, such as: (1) if there is an imbalance among the phases that results in AC current flow in the neutral; (2) Faults from phase to phase or phase to neutral which have a DC offset that decays generally within a few 100 cycles; or (3) large electro magnetic disturbance causing a GIC to flow, which is primarily a DC current.

When there is a phase to ground fault there will be a magnitude of zero sequence components whose magnitude is dependent on the impedance of the fault. Under a phase to ground fault the current waveform may become highly distorted but it rarely contains DC components or low order harmonics that last a significant period of time.

Figure 2:
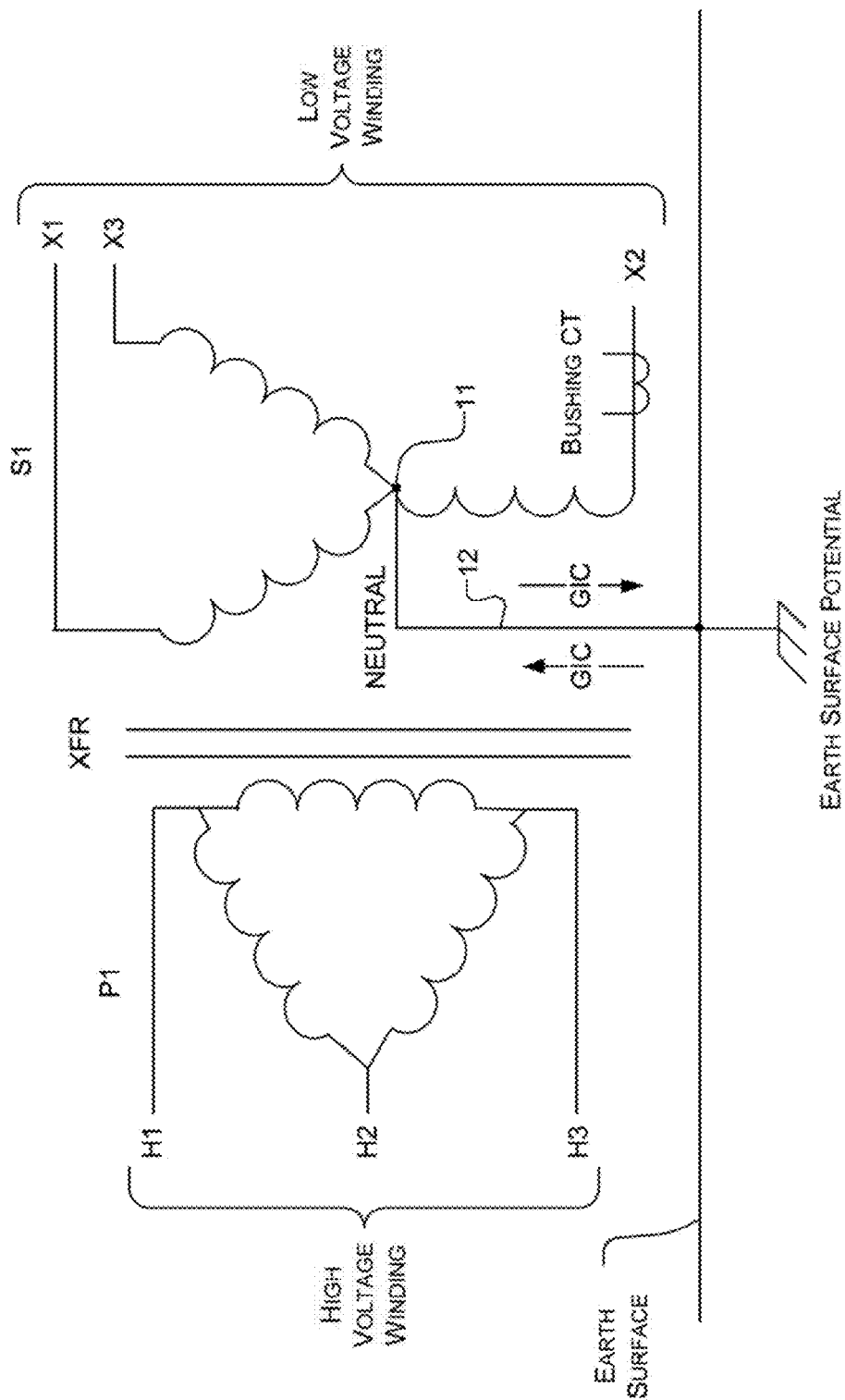
FIG. 2 is a simplified schematic diagram showing the flow of a geo-magnetically induced current (GIC) in the grounded neutral line of a typical Delta-Wye connected power transformer.

However, when a significant electro-magnetic disturbance occurs, DC currents ($I_{NDC}$ or "GIC"), as shown in FIG. 2, will flow in the neutral line 12 of the transformer which may range from several Amps to upwards of several hundred Amps. The disturbance can cause the GIC to flow from several minutes to over an hour. If the magnitude of the GIC is large enough the transformer's core will begin to saturate due, in part, to the magnitude of the stray flux that is dependent on flux present in the core which in turn is a function of transformer loading and which causes the transformer to be damaged. When the transformer core saturates, heating will increase due to stray magnetic flux which induce eddy currents in tie plates, tank walls, windings and other metallic components present. Should the transformer be loaded at, or near, its rated level, the net result will be for the transformer to operate at these levels with significant overheating leading to loss of dielectric integrity of the transformer's insulation system and hence failure of the transformer.

Figure 3:
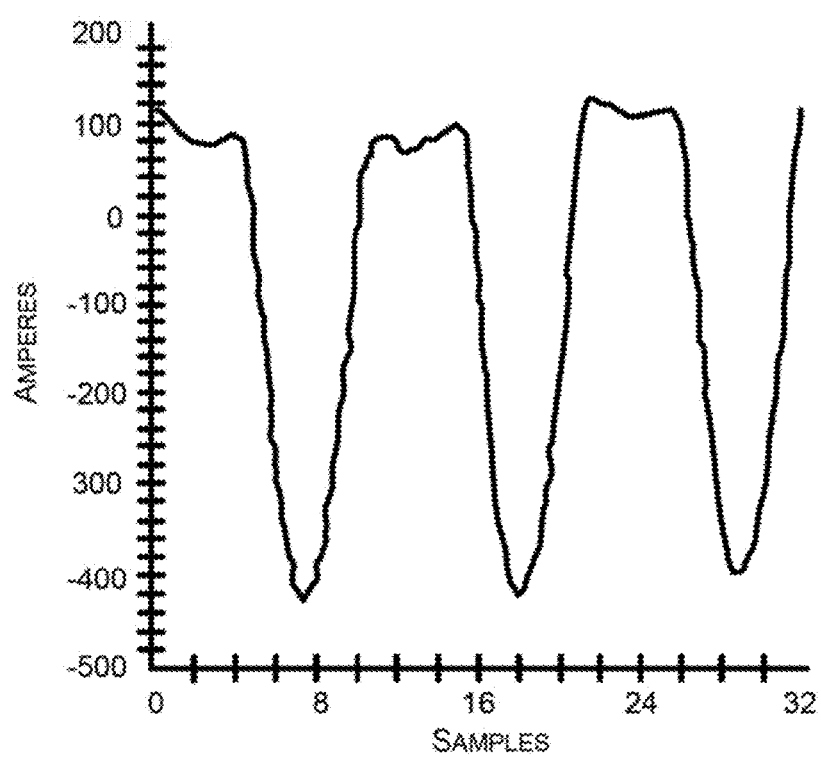
FIG. 3 is a waveform diagram illustrating the highly distorted waveform present on the output winding of a transformer when the transformer core saturate.

The magnitude of the GIC, in and of itself, may not be determinative that the transformer core is undergoing saturation. However, when the core does undergo saturation, the AC waveforms on the output (secondary) windings, also referred to as "phase conductors", become highly distorted as shown in FIG. 3 producing harmonic signals. Applicants recognized that detecting and analyzing the harmonics present on the output windings can be used to ascertain the actual extent of core saturation.

Figure 4:
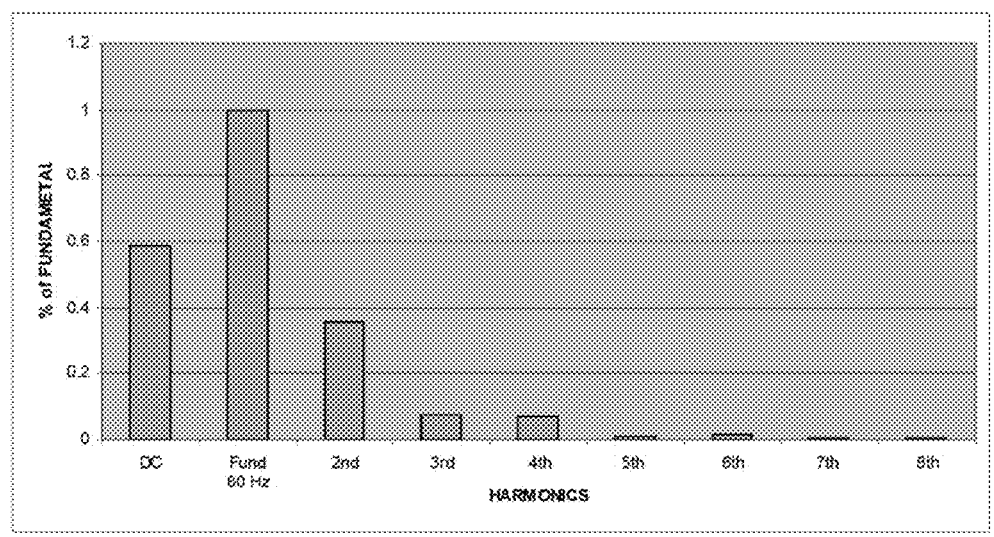
FIG. 4 is a chart illustrating some of the harmonics which may be present on the output windings of a transformer when the transformer core saturates.

Applicants also recognized that when the core saturates there is a significant increase in the level of even harmonics. Applicants also recognized that when core saturation occurs due to an electro-magnetic disturbance, the even harmonic will always be greater than the adjacent (higher order) odd harmonic as shown in FIG. 4. That is, the $2^{nd}$ harmonic will be greater than the $3^{rd}$ harmonic, the $4^{th}$ harmonic greater than the $5^{th}$ harmonic and so on. Accordingly, systems embodying the invention include circuitry for analyzing and processing certain relationships between the "even" and adjacent higher order "odd" harmonics.

Thus, systems and circuits embodying the invention (see FIGS. 5 and 6) sense the amplitude of the current (GIC)

flowing in the neutral line of the transformer and detect the nature of the harmonics present in the load current. In the drawings the load current is sensed by connecting a current transformer to an output winding to ascertain whether a potentially dangerous saturated core condition exists. [However, this could be also be done by sensing the harmonics reflected on the primary windings.]

Figure 5:
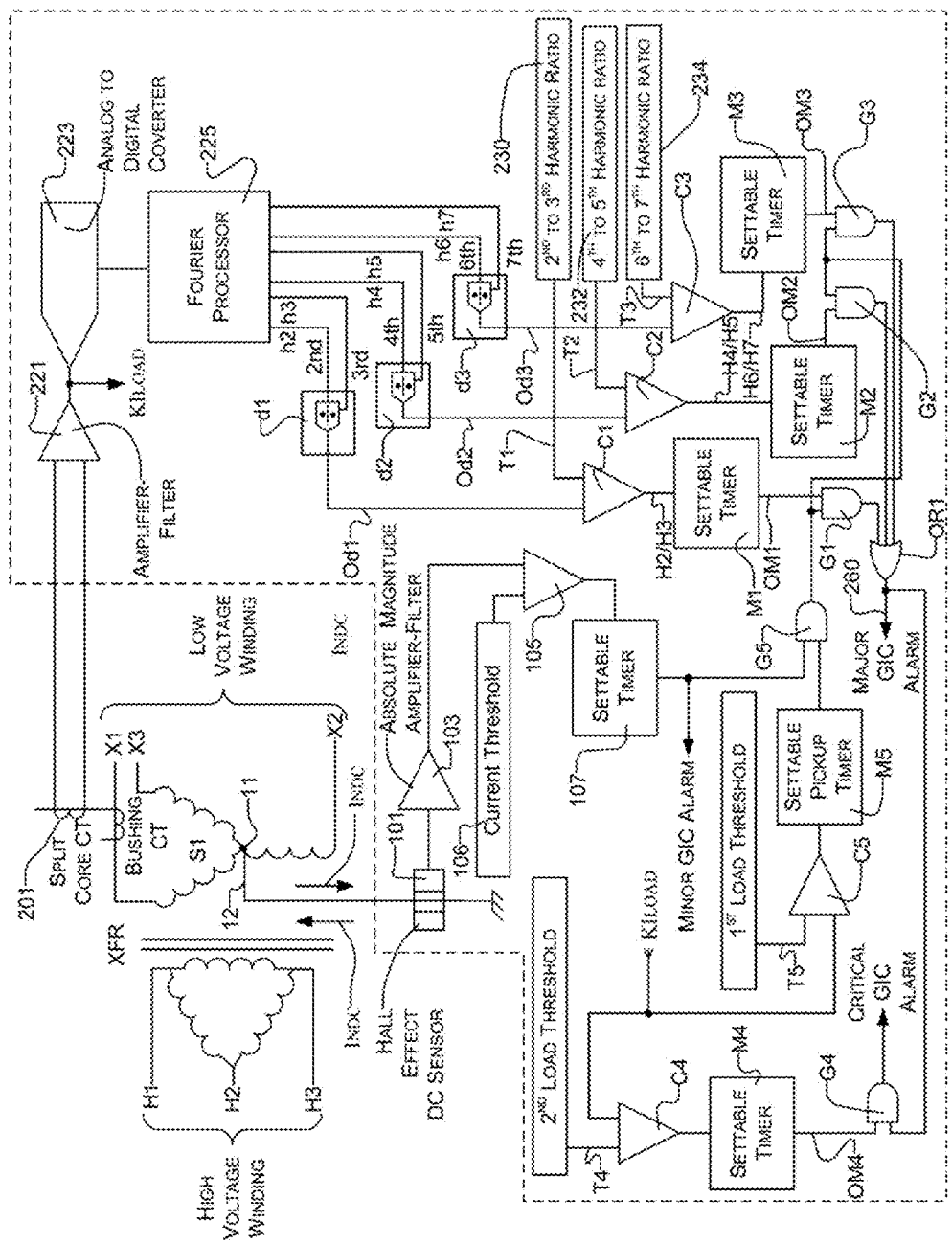
FIG. 5 is a detailed semi-block semi-schematic diagram of a protective circuit embodying the invention.

In FIG. 5 the grounded neutral line 12 of the transformer T1 is coupled to a Hall Effect transducer 101 to sense the DC current level ($I_{NDC}$ or GIC) flowing in the neutral line. Alternatively, the current level could be measured by using a serially connected resistor and sensing the voltage developed. The Hall Effect transducer 101 is designed to detect both positive and negative current flow and to produce a signal which represents the absolute magnitude of the measured DC signal. The Hall Effect transducer 101 is connected to the input of an absolute magnitude amplifier/filter 103 whose output is applied to the input of a comparator 105 biased with a predetermined DC current threshold level 106. The threshold level 106 is selected based on the transformer design. When the magnitude of the signal from the amplifier 103 exceeds the threshold level 106 applied to the comparator 105, the comparator output changes state (e.g., goes High) indicating an excessive GIC condition. Thus, the level of the GIC (i.e., $I_{NDC}$) can be detected through the use of a DC current sensor such as Hall Effect sensor (e.g., 101) to measure the DC current flow in the neutral line. Alternatively, the GIC can be determined by measuring the voltage across a shunt resistor (not shown) in series with the neutral line termination of the transformer.

Excessive GIC (i.e., $I_{NDC}$) levels (those causing the threshold 106 to be exceeded) lasting less than several minutes are not generally a problem. However, excessive GIC levels lasting more than several minutes are a major problem and need to be addressed. Therefore, the output of the comparator 105 is fed to a timer circuit 107 whose function is to change state (e.g., go High) only if the excessive GIC condition lasts for more than a predetermined time period (tD). If the excessive GIC condition lasts for less than the predetermined time period (tD), the output of timer circuit 107 will not change state. However, if the excessive GIC condition lasts for more than the predetermined time period (tD), the output of the timer circuit 107 will change state producing a first alarm signal (Minor GIC Alarm) indicating that a GIC condition of significant magnitude and duration is occurring. This first signal (Minor GIC Alarm) may be used to provide an audible or visual alert to the owner/operator of the transformer that the transformer is being subjected to an excessive GIC condition in the transform neutral line.

Figure 6:
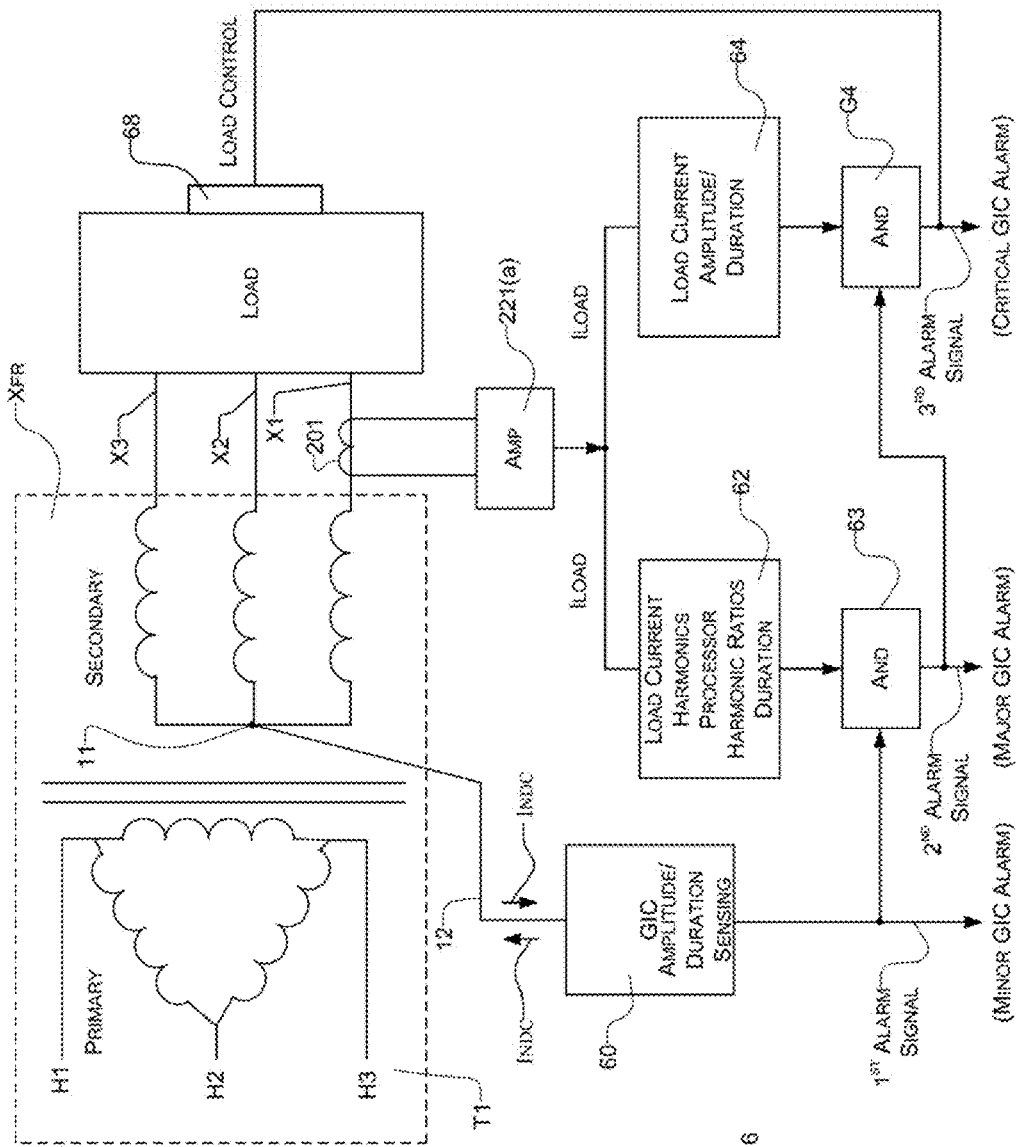
FIG. 6 is a simplified semi-block semi-schematic diagram of a protective circuit embodying the invention.

Another aspect of the invention includes circuitry for measuring the phase currents in selected ones of the output windings of the transformer, XFR. [As noted above the harmonics sensing could also be done by looking at a primary winding.] In FIGS. 5 and 6 a current transducer 201 is shown connected about output phase conductor winding X1. The current transducer 201 used to sense the load current on the phase conductor may be a split core current transformer (CT) connected over the secondary conductor of the bushing CT. [Note that this is by way of example only and other known current sensing schemes may be used.] The secondary of the split core CT 201 is connected to an amplifier/filter 221 which includes filtering circuits used to eliminate frequencies above the sampling rate that could result in errors if not appropriately filtered.

The output of amplifier/filter 221, which is an analog signal, is applied to a high precision analog to digital (A/D) converter 223 which functions to sample and convert the signal from the analog domain to the digital domain. Once the sampled digital equivalent is recovered it can be processed to derive the individual harmonics present in the waveform using Fast Fourier Transform techniques.

Equation [1] is a formula used to extract the individual harmonics contained in the sampled waveform relative to a fundamental frequency $$F_n = 1/m \sum_{k=0}^{m-1} f_k e^{-j2\Pi ln/m} \quad [1]$$

Where:
f(l)=fundamental frequency of the signal;

$$f_k = f(k\Delta t), \Delta t = 1/(m \times f(t)); \quad [2]$$

n=the integer harmonic of the fundamental frequency f(t);
m=maximum integer harmonic of the fundamental to be examined; and
k=discrete sample.

By way of example, for the fifth harmonic m=5 and at the fundamental frequency of 60 Hz, the minimum sampling rate to avoid aliasing is 600 samples/second.

The functional blocks 223 and 225 derive the harmonics $h_2$-$h_n$ and feed the even harmonic $h_e$ (or $F_e$) and adjacent odd harmonic $h_{e+1}$ (or $F_{e+1}$), where e=2, 4, 6, . . . , m into individual divider pairs that derives the ratio of even to adjacent (higher order) odd harmonic.

In FIG. 5 the output of A/D converter 223 is applied to a Fourier processor 225 which is designed to produce the $2^{nd}$, $3^{rd}$, $4^{th}$, $5^{th}$, $6^{th}$ and $7^{th}$ harmonics (h2, h3, h4, h5, h6, h7) of the load signal. The $2^{nd}$ and $3^{rd}$ harmonics are fed to a first divider d1; the $4^{th}$ and $5^{th}$ harmonics are fed to a second divider d2; and the $6^{th}$ and $7^{th}$ harmonics are fed to a third divider d3. The output Od1 of divider d1 is fed to a comparator C1, the output Od2 of divider d2 is fed to a comparator C2; and the output Od3 of divider d3 is fed to a comparator C3.

Each output (Od1, Od2, Od3) of the dividers (d1, d2, d3) will have a certain signal condition (e.g., "Low") when the odd harmonic (e.g., h3, h6, h7) is greater than its corresponding adjacent (lower order) even harmonic (e.g., h2, h4, h6) and will have the other signal conditions (e.g., "High") if the adjacent (lower order) even harmonic (e.g., h2, h4, h6) is greater than, or equal to, the adjacent (higher order) odd (e.g., h3, h5, h7) harmonic.

The output (Od1, Od2, Od3) from each divider is then fed into a first input of a correspondingly numbered comparator (C1, C2, C3). A threshold signal (T1, T2, T3) is applied into a second input of each correspondingly numbered comparator. The thresholds T1, T2 and T3 are generated by circuits 230, 232 and 234 which set a required ratio of: (a) the $2^{nd}$ to $3^{rd}$ harmonic to determine T1; (b) the $4^{th}$ to $5^{th}$ harmonic to determine T2; and (c) the $6^{th}$ to $7^{th}$ harmonic to determine T3.

Each comparator (C1, C2, C3) has an output which is applied to and triggers a corresponding timer circuit (M1, M2, M3). Each comparators (C1, C2, C3) triggers its corresponding tinier (M1, M2, M3) when the even harmonic (see FIG. 4) at its input is larger than the adjacent odd harmonic at its input by a pre-determined level. If it is greater, the comparator will change state and trigger its corresponding settable pickup timer.

Each settable timer (M1, M2, M3) will change state (e.g., go High) only if triggered by its corresponding comparator for the full time duration to which the timer (M1, M2, M3) is set. The time setting of the timer is based on how long the user is able to ignore the effect of core saturation. The outputs (OM1, OM2, OM3) of the harmonic ratio pickup timers (M1, M2, M3) play be referred to herein and in the appended claims as "harmonic status signals". Signals OM1, OM2, and OM3 are fed to an input of a correspondingly numbered two input AND gate (G1, G2, G3).

The second input of AND gates G1, G2, G3 are all connected to the output of a two input AND gate G5. The two inputs of AND gate G5 are: (1) the output of timer 107 at which is produced the first alarm signal (i.e., minor GIC alarm) which is indicative of $I_{NDC}$ being excessive, and (2) a signal from timer M5 which is generated when $KI_{LOAD}$ exceeds a predetermined $1^{st}$ Load Threshold (T5). Until the load current represented by $KI_{LOAD}$ exceeds a selected threshold value T5 the output of gate G5 "disables" gates G1, G2 and G3. The output of comparator C5 drives timer M5 which is applied to one input of two input AND gate G5 and controls its output to inhibit the generation of a Major GIC Alarm if the transformer is under a lightly loaded condition even though the transformer core may be saturated. Such saturation (under light load) does not jeopardize the operation of the transformer and therefore may be ignored. (Note: a customer may opt to bypass C5 and M5 and have the Minor Alarm signal connected to an input of gates G1, G2, G3).

The output of AND gates G1, G2, and G3 are applied to the inputs of an OR gate, OR1, having an output 260 at which is produced a second alarm signal, also identified as a Major GIC alarm. The Major GIC alarm indicates that an excessive GIC level is present and there is sufficient magnitude of AC harmonics evidencing saturation of the transformer's core, and also that the load current exceeds a $1^{st}$ Load Threshold (T5). This second alarm signal (Major GIC Alarm) may be used to provide an audible or visual alert to the owner/operator of the transformer that the transformer is being subjected to an excessive GIC condition in the transformer's neutral line and that the transformer core is saturating.

Additional circuitry comprising a comparator C4, a timer M4 and an AND G4 may be used to determine if the load current is too high when the transformer core is saturated and to produce a signal identified as a Critical GIC Alarm. The output 260 of OR gate OR1 is also applied to one input of two input AND gate G4. The second input to AND gate G4 is connected to the output of timer M4 which is driven by comparator C4 responsive to the load current level and a load pick up threshold (T4). If the load current ($KI_{LOAD}$) exceeds the load pick up threshold (T4), the output of comparator C4 changes state (e.g., goes Hi) and drives timer M4 and sets its output (e.g., HI) if the load current exceeds the load threshold T4 for a predetermined time period. The output of M4 and the output 260 of OR gate OR1 are applied to the two inputs of AND gate G4. Then, if (a) the output of timer 107 indicates that the GIC level has been high for more than a predetermined time period; (b) the output of OR gate OR1 indicates that the harmonic contents of the load signal is indicative of core saturation; and (c) the load current is above a predetermined threshold, the gate G4 produces an output signal which may be termed a Critical GIC Alarm.

It has thus been shown that saturation of the core of a power transformer can be reliably determined by sensing the current flowing in the neutral line and its duration and by sensing the harmonics present on the input or output lines of the transformer. Based on the determination that core saturation exists and its duration corrective action can be taken to prevent damage to the transformer. This is important because, as noted above, core saturation due to GIC causes stray fluxes which may be of very large magnitude. Large magnitude stray flux will cause major to extreme heating. Abnormal heating causes two problems: (1) General degradation of the insulation material in the location of the hotspot caused by stray flux; and (2) Extreme heating at a location where there is water in the oil or insulation material can be converted to water vapor which causes undue and damaging vapor pressure and a breakdown of dielectric integrity.

FIG. 6 is a block diagram including circuitry of the type shown in FIG. 5 and a feedback loop (the $3^{rd}$ alarm signal to load control) to automatically control a reduction in the load when a critical GIC alarm condition occurs. FIG. 6 includes: (1) Circuitry contained in block 60 for sensing the amplitude of $I_{NDC}$ or GIC and its duration in order to produce a $1^{st}$ alarm signal; (2) Circuitry contained in block 62 for sensing the amplitude of the harmonic content of the load current ($I_{LOAD}$) and its duration in order to produce a $2^{nd}$ alarm signal at the output of an AND network 63, if the $1^{st}$ alarm signal is present; and (3) Circuitry contained in block 64 for sensing the amplitude of the load current ($I_{LOAD}$) and its duration in order to produce a $3^{rd}$ or critical alarm signal at the output of an AND network G4, if the $2^{nd}$ alarm signal is present. In FIG. 6 the critical GIC alarm signal is fed back to a load control module 68 to automatically reduce the load when a critical alarm condition is present.

Figure 7A:
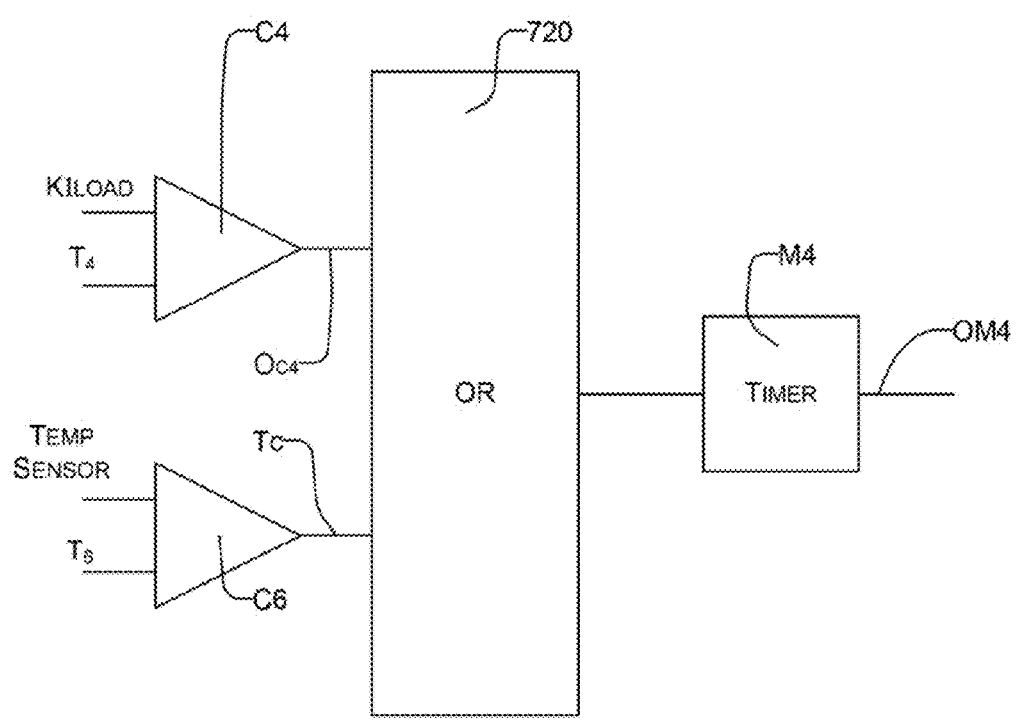
FIGS. 7A and 7B are schematic diagrams of transformer temperature circuitry for use with the circuits of FIGS. 5 and 6.
Figure 7B:
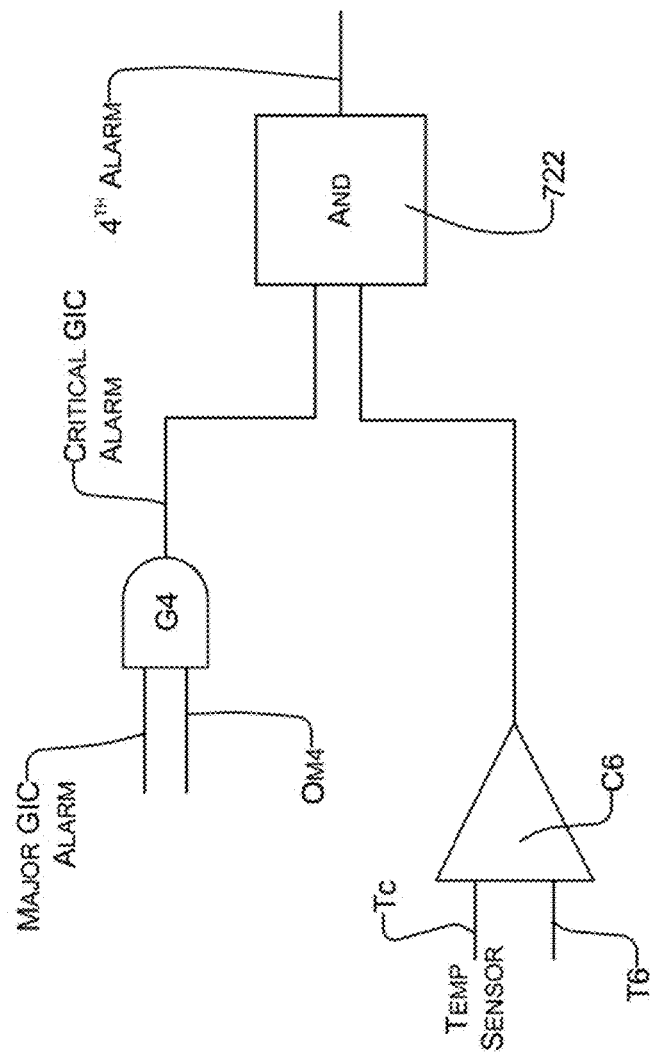

Core saturation and the large currents which can flow may cause the temperature of the power transformer to rise above certain critical values. It is therefore desirable to generate an alarm condition when there is an indication of core saturation and a temperature in excess of a critical value. FIGS. 7A and 7B show two different circuits for sensing the power transformer temperature and whether there is core saturation.

In FIG. 7A, a temperature sensor, which may be any known device for directly or indirectly sensing the temperature of the transformer, is applied to an input of a comparator C6. The other input to comparator C6 is a threshold temperature level T6. When the temperature sensor indicates that the temperature of the transformer exceeds the threshold temperature T6, a critical temperature signal Tc (e.g., High) is produced at the output of comparator C6. The critical temperature signal Tc is applied to an OR gate 720. Concurrently, the load pick up threshold (T4) and the load current ($KI_{LOAD}$) are applied to a comparator C4 to produce an output signal OC4 which assumes a condition (e.g., High) when the load current is above the threshold value of T4. The signal OC4 is also applied to OR gate 720 whose output is applied to a timer M4, as shown in FIG. 5. The output OM4 of M4 would thus be triggered (e.g., go High) if either: (a) the Load current is above a critical value (T4) or (b) the transformer temperature is above a critical value (T6). If a major GIC alarm is present, a critical GIC alarm signal would then be produced which would be a function of transformer temperature level or transformer load current level.

In FIG. 7B, the temperature sensor and the temperature threshold 16 are applied to a comparator C6 whose output Tc is applied to an input of an AND gate 722. The other input to AND gate 722 is the output of And gate G4, as shown in FIG. 5, whose output is the critical GIC alarm signal. Accordingly, the circuit of FIG. 7B produces a $4^{th}$ alarm signal when the $3^{rd}$ (critical GIC) alarm signal is present and the temperature of the transformer is above the critical value T6.

It should be noted that the particular circuits shown are for purpose of illustration and that the invention may be practiced using different circuitry than those shown for sensing the amplitude of the current flowing in the neutral line and for sensing the harmonics present when the core saturates and that the alarms can be audible devices and/or electronic displays.

Figure 8:
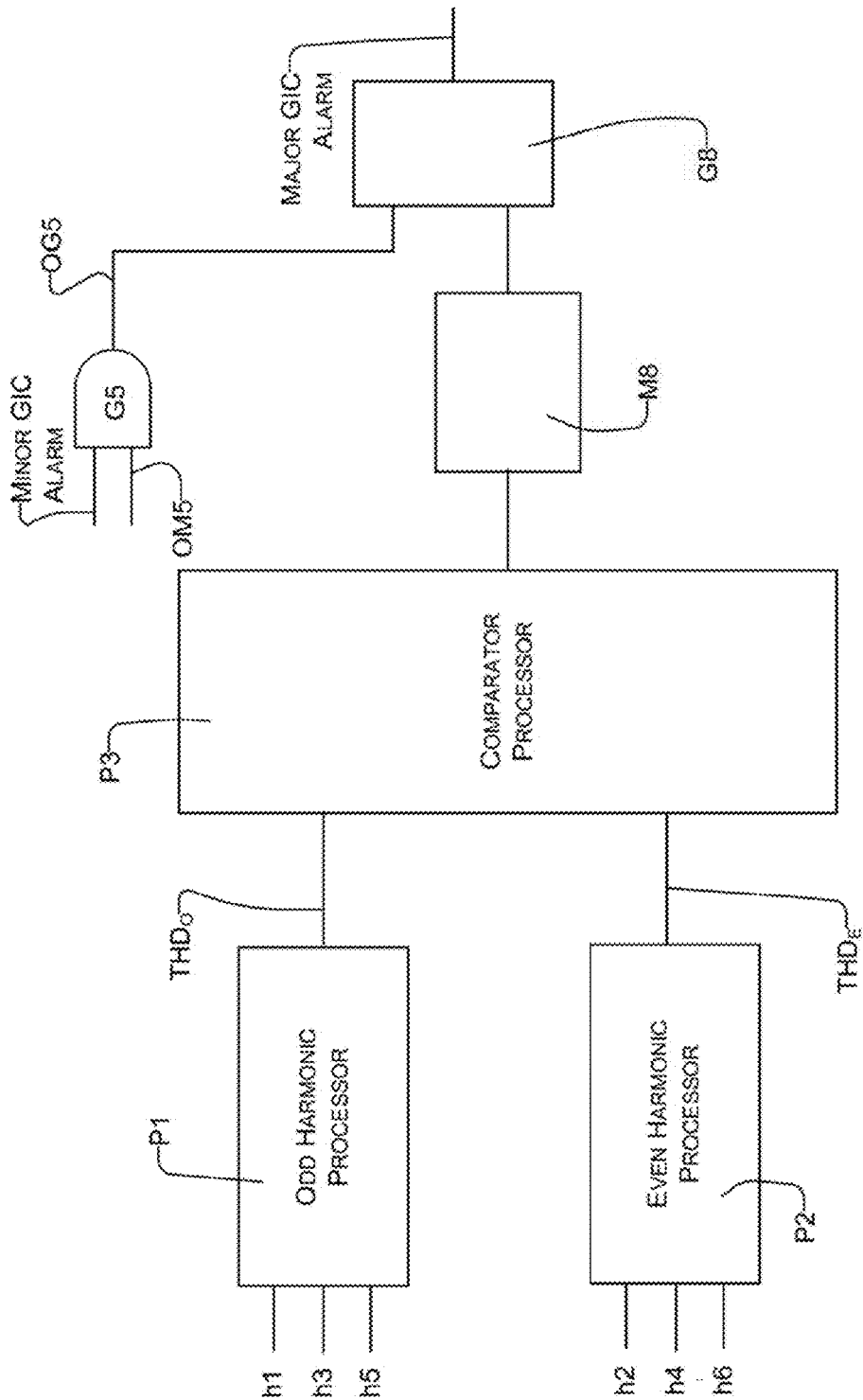
FIG. 8 is block diagram of alternate circuitry for processing harmonic signals for use in practicing the invention.

In addition to the aforementioned use of the harmonic ratios, the use of the total even harmonic distortion ($THD_E$)

versus the total odd harmonic distortion ($THD_O$) can be utilized to implement this invention as shown in FIG. 8. The even harmonics ($h_2$, $h_4$, $h_6$) can be processed via a processor P1 to produce $THD_E$, where $$THD_E = \sqrt{h_2^2 + h_4^2 + h_6^2} \quad [3]$$

And, where $h_2$, $h_4$, $h_6$ are the respective $2^{nd}$, $4^{th}$, and $6^{th}$ harmonics.

The odd harmonics (h3, h5, h7) can be processed via a processor P2 to produce THDO, where $$THD_O = \sqrt{h_3^2 + h_5^2 + h_7^2} \quad [3]$$

And where $h_3$, $h_5$, $h_7$ a the respective $3^{rd}$, $5^{th}$ and $7^{th}$ harmonics.

The signals $THD_E$ and $THD_O$ can then be applied to a processor P3 to compare and process the ratio of $THD_O$ to $THD_E$, and if the resultant ratio exceeds a preset threshold condition, it can start a timer M8 which can be ANDed by gate G8 with the output of a gate G5 (see FIG. 5) to produce a Major GIC Alarm signal.

What is claimed is:

1. A system for protecting a transformer having: (a) an input winding, (b) at least one output winding intended to be coupled to a load, and (c) having a neutral line returned to ground, and wherein when the transformer is subjected to electro-magnetic conditions excessive currents can flow in the neutral line and cause the core of the transformer to saturate, the protective system including:
   (a) circuitry for sensing the level of the current flowing in the neutral line, hereafter referred to as "$I_N$", and for determining whether the of level $I_N$ is above a predetermined value for more than a predetermined time period and for generating a first signal alarm when this condition occurs;
   (b) circuitry for sensing selected even and odd harmonics of the current flowing in the output winding coupled to the load and processing the selected harmonics to determine whether predetermined relationships pertaining to the harmonics indicative of core saturation are present for a preselected time duration and producing a harmonics status signal corresponding thereto; and
   (c) circuitry responsive to the first signal alarm and to the harmonic status signal for producing a second alarm signal.

2. A system as claimed in claim 1 further including circuitry for sensing the level of the load current and generating a third alarm signal if the load current level is above a given value and said second alarm signal is present.

3. A system as claimed in claim 2, wherein said first, second and third signals include at least one of a visual or audible alarm.

4. A system as claimed in claim 1 wherein said circuitry for sensing the harmonics of the current flowing in the load includes an analog to digital converter and a Fourier signal processor for producing selected even and odd harmonics and means for determining whether certain predetermined relationships between the odd and even harmonics indicative of core saturation are present.

5. A system as claimed in claim 4 wherein each even harmonic and the adjacent next higher odd harmonic are applied to a corresponding comparator to produce a signal when the even harmonic exceeds the adjacent next higher odd harmonic by a predetermined amount.

6. A system as claimed in claim 5 wherein each said corresponding comparator is coupled to a settable timer to produce a harmonic status signal when an even harmonic exceeds the next adjacent higher order odd harmonic by a predetermined amount for preset time period.

7. A system as claimed in claim 1 wherein said circuitry for sensing selected even and odd harmonics includes a current transformer coupled to said at least one output winding and wherein a load is connected to said output winding.

8. A system as claimed in claim 1 wherein said circuitry for sensing the level of the current flowing in the neutral line includes a Hall effect device to measure the GIC flowing in the neutral line.

9. A system as claimed in claim 2 including means, responsive to the third signal, coupled to the load for automatically reducing the load current level.

10. A system as claimed in claim 1 further including circuitry for sensing the level of the load current and the temperature of the transformer and generating a third alarm signal if said second alarm signal is present and if either the load current level is above a given value or the temperature of the transformer is above a given temperature for a predetermined time period.

11. A system as claimed in claim 1 further including circuitry for sensing the level of the load current and generating a third alarm signal if the load current level is above a given value and said second alarm signal is present and further including circuitry for sensing the temperature of the transformer and producing a critical temperature signal if the transformer temperature is above a predetermined value and producing a fourth alarm signal if the third alarm signal is present.

12. A system as claimed in claim 1 further including circuitry for sensing the level of the load current and inhibiting the production of said second alarm if the load current is below a predetermined level.

13. A system comprising: a power transformer having an input winding for receiving an input voltage and an output winding intended to be coupled to a load, said transformer also having a neutral line which is returned to ground, and wherein excessive currents can flow in the neutral line and cause the core of the transformer to saturate; and circuitry for determining whether the core of the transformer is saturating and for protecting the transformer comprising:
   (a) circuitry for sensing the level of the current ($I_N$) flowing in the neutral line and for determining whether ($I_N$) is above a predetermined value for more than a predetermined time period and for then generating a first signal alarm when this condition occurs:
   (b) circuitry for sensing selected harmonics of the current flowing in the load and processing the selected harmonics to determine whether predetermined relationships pertaining to the even and odd harmonics indicative of core saturation are present and if their duration exceed a preselected time producing a harmonics status signal corresponding thereto; and
   (c) circuitry responsive to the first signal alarm and to the harmonics status signal for producing a second alarm signal.

14. A system as claimed in claim 13 further including circuitry for sensing the level of the load current and generating a third alarm signal if the load current level is above a given value and said second alarm signal is present.

15. A system as claimed in claim 14 further including circuitry responsive to said third alarm signal for controlling the load in order to reduce the level of the load current.

16. A system as claimed in claim 13 further including circuitry for sensing the level of the load current and the temperature of the transformer and generating a third alarm signal if said second alarm signal is present and if either the load current level is above a given value or the temperature of the transformer is above a given temperature for a predetermined time period.

17. A system as claimed in claim 13 further including circuitry for sensing the level of the load current and generating a third alarm signal if the load current level is above a given value and said second alarm signal is present and further including circuitry for sensing the temperature of the transformer and producing a critical temperature signal if the transformer temperature is above a predetermined value and producing a fourth alarm signal if the third alarm signal is present.

18. A system for protecting a transformer having: (a): an input winding, (b) at least one output winding intended to be coupled to a load, and (c) having a neutral line returned to ground and wherein when the transformer is subjected to electro-magnetic conditions excessive currents can flow in the neutral line and cause the core of the transformer to saturate, the protective system including:
  (a) circuitry for sensing the level of the current flowing in the neutral line, hereafter referred to as "$I_N$", and for determining whether the of level $I_N$ is above a predetermined value and producing a first signal indicative thereof;
  (b) circuitry for sensing selected harmonics of the current flowing in the output winding coupled to the load and processing the selected harmonics to determine whether predetermined relationships pertaining to the harmonics indicative of core saturation are present and for producing a harmonics status signal corresponding thereto;
  (c) circuitry for sensing the level of the load current and for determining whether it is above a given value and producing a second signal indicative thereof; and means responsive to selected ones of said first and second signals and said harmonics status signal for producing alarm signals when selected one of said signals exist for more than a predetermined time period.

19. A system as claimed in claim 18 wherein a first alarm signal is produced when the current ($I_N$) flowing in the neutral line is above a predetermined value for more than a predetermined time period; and wherein a second signal is produced if the first signal is present and the harmonics status signal indicative of core saturation is present and the load current is above a first level.

* * * * *